United States Patent
Enya et al.

(10) Patent No.: US 8,487,327 B2
(45) Date of Patent: *Jul. 16, 2013

(54) GROUP-III NITRIDE SEMICONDUCTOR DEVICE, EPITAXIAL SUBSTRATE, AND METHOD OF FABRICATING GROUP-III NITRIDE SEMICONDUCTOR DEVICE

(75) Inventors: Yohei Enya, Itami (JP); Yusuke Yoshizumi, Itami (JP); Takashi Kyono, Itami (JP); Takamichi Sumitomo, Itami (JP); Katsushi Akita, Itami (JP); Masaki Ueno, Itami (JP); Takao Nakamura, Itami (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/484,776

(22) Filed: May 31, 2012

(65) Prior Publication Data

US 2012/0299010 A1 Nov. 29, 2012

Related U.S. Application Data

(63) Continuation of application No. 12/836,144, filed on Jul. 14, 2010, now Pat. No. 8,207,544.

(30) Foreign Application Priority Data

Jul. 15, 2009 (JP) .................. 2009-167140

(51) Int. Cl.
*H01L 33/00* (2010.01)
*H01L 29/04* (2006.01)

(52) U.S. Cl.
USPC ............ 257/94; 257/96; 257/103; 257/627; 257/628; 257/E33.002; 257/E33.025; 438/47

(58) Field of Classification Search
USPC ............ 257/94, 96, 103, 627, 628, E33.002, 257/E33.025; 438/47
See application file for complete search history.

(56) References Cited

U.S. PATENT DOCUMENTS

| | | |
|---|---|---|
| 7,470,608 B2 | 12/2008 | Ishibashi et al. |
| 8,207,544 B2 * | 6/2012 | Enya et al. ............. 257/94 |

(Continued)

FOREIGN PATENT DOCUMENTS

| | | |
|---|---|---|
| JP | 2003-229645 A | 8/2003 |
| JP | 2008-010835 A | 1/2008 |

(Continued)

OTHER PUBLICATIONS

Ueda, M. et al. "Epitaxial growth and optical properties of semipolar (11-22) GaN and InGaN/GaN quantum wells on GaN bulk substrates," Applied Physics Letters, 89, pp. 211907-1-211907-3 (2006).
Hirai, A. et al. "Formation and reduction of pyramidal hillocks on m-plane {1-100} GaN," Applied Physics Letters, 91, pp. 191806-1-191806-3 (2007).

(Continued)

*Primary Examiner* — Ngan Ngo
(74) *Attorney, Agent, or Firm* — Venable LLP; Michael A. Sartori; Tamatane J. Aga

(57) ABSTRACT

A III-nitride semiconductor device has a support base comprised of a III-nitride semiconductor and having a primary surface extending along a first reference plane perpendicular to a reference axis inclined at a predetermined angle with respect to a c-axis of the III-nitride semiconductor, and an epitaxial semiconductor region provided on the primary surface of the support base. The epitaxial semiconductor region includes GaN-based semiconductor layers. The reference axis is inclined at a first angle from the c-axis of the III-nitride semiconductor toward a first crystal axis, either the m-axis or a-axis. The reference axis is inclined at a second angle from the c-axis of the III-nitride semiconductor toward a second crystal axis, the other of the m-axis and a-axis. Morphology of an outermost surface of the epitaxial semiconductor region includes a plurality of pits. A pit density of the pits is not more than $5 \times 10^4$ cm$^{-2}$.

25 Claims, 12 Drawing Sheets

U.S. PATENT DOCUMENTS

| | | |
|---|---|---|
| 2010/0059759 A1 | 3/2010 | Akita et al. |
| 2010/0276663 A1 | 11/2010 | Enya et al. |
| 2011/0182311 A1 | 7/2011 | Yoshizumi et al. |
| 2012/0008660 A1 | 1/2012 | Fujii et al. |

FOREIGN PATENT DOCUMENTS

| | | |
|---|---|---|
| JP | 2008-060375 A | 3/2008 |
| JP | 2008-266113 A | 11/2008 |
| JP | 4475358 B1 | 6/2010 |

OTHER PUBLICATIONS

Yamada, H. et al. "Impact of substrate miscut on the characteristic of *m*-plane InGaN/GaN light emitting diodes," Japanese Journal of Applied Physics, vol. 46, No. 46, pp. L1117-L1119 (2007).

Yamada, H. et al. "Effects of off-axis GaN substrates on optical properties of *m*-plane InGaN/GaN light-emitting diodes," Journal of Crystal Growth, 310, pp. 4968-4971 (2008).

Office Action issued in Japanese Patent Application No. 2009-167140 dated May 14, 2013.

* cited by examiner (a)

(b)

(c)

(a)

(b)

(a)

(b)

(a)

(b)

(a)

(b)

(a)

(b)

GROUP-III NITRIDE SEMICONDUCTOR DEVICE, EPITAXIAL SUBSTRATE, AND METHOD OF FABRICATING GROUP-III NITRIDE SEMICONDUCTOR DEVICE

CROSS-REFERENCE TO RELATED APPLICATIONS

This application is a Continuation of U.S. patent application Ser. No. 12/836,144, filed Jul. 14, 2010 now U.S. Pat. No. 8,207,544, which claims the benefit of Japanese Patent Application No. 2009-167140, filed Jul. 15, 2009, both of which are incorporated by reference in their entirety.

BACKGROUND OF THE INVENTION

1. Field of the Invention

The present invention relates to a III-nitride semiconductor device, an epitaxial substrate, and a method for fabricating the III-nitride semiconductor device.

2. Related Background Art

Non Patent Literature 1 discloses the effect of miscut in m-plane GaN substrates. The investigation was carried out using (1-100)-plane GaN substrates having miscut angles formed toward the [000-1] direction. The miscut angles were 0.45 degrees, 0.75 degrees, 5.4 degrees and 9.6 degrees. The surface morphology was improved with increase in miscut angle.

Non Patent Literature 2 discloses pyramidal hillocks on m-plane GaN. The hillocks are reduced with change in miscut angle ranging from zero degrees to 10 degrees in the direction from the a-axis to c⁻-axis.

Non Patent Literature 3 discloses inclination of a crystal axis of a GaN substrate in optical properties of InGaN/GaN light emitting diodes produced on m-plane GaN substrates.

Non Patent Literature 4 describes an InGaN/GaN quantum well structure grown on semipolar (11-22)-plane GaN substrates.

Non Patent Literature 1: Hisashi Yamada et al., Jpn. J. Appl. Phys. Vol. 46, No. 46, (2007), pp. L1117-L1119

Non Patent Literature 2: A. Hirai et al., Appl. Phys. Lett. 91, 191906 (2007)

Non Patent Literature 3: Hisashi Yamada et al., J. Crystal Growth, 310, (2008), pp. 4968-4971

Non Patent Literature 4: M. Ueda et al., Appl. Phys. Lett. 89 211907 (2006)

SUMMARY OF THE INVENTION

In a GaN film epitaxially grown on the semipolar GaN surface of a Group III GaN-based semiconductor substrate such as GaN, the surface morphology thereof is not good. According to Inventors' knowledge, the epitaxial growth on semipolar GaN-based semiconductors exhibits a complexion different from the growth on crystal planes of plane orientations such as c-plane, m-plane and a-plane.

According to Inventors' experiment, relatively large depressions such as pits appear in the surface morphology of the epitaxial film on the semipolar GaN-based semiconductor. The pits in the semipolar plane have a shape different from that of pits in a c-plane. The pits in the semipolar surface of the epitaxial film have a asymmetric shape, and the shape of the openings is horizontally long or vertically long and their aspect ratios are large. Hence, the pits in the semipolar surface affect a large area in the surface of the epitaxial film.

According to Inventors' investigation, the pits in the semipolar surface increase a leakage current in semiconductor devices. When an electrode is formed on the epitaxial film of the surface morphology that includes the foregoing pits, leakage occurs in the application of forward and reverse voltages because of the anomalous morphology. Furthermore, the full width at half maximum of emission wavelength is increased in light emitting devices.

It is an object of the present invention to provide a III-nitride semiconductor device including a semipolar epitaxial film with an excellent surface morphology, it is another object of the present invention to provide an epitaxial substrate for this III-nitride semiconductor device, and it is a further object of the present invention to provide a method of fabricating the III-nitride semiconductor device.

Means for Solving the Problem

A III-nitride semiconductor device according to an aspect of the present invention comprises: (a) a support base comprising a III-nitride semiconductor and having a primary surface which extends along a first reference plane perpendicular to a reference axis inclined at a predetermined angle ALPHA with respect to the c-axis of the III-nitride semiconductor; and (b) an epitaxial semiconductor region provided on the primary surface of the support base. The epitaxial semiconductor region comprises GaN-based semiconductor layers; the reference axis is inclined at a first angle ALPHA1 in a range of not less than 10 degrees and less than 80 degrees with respect to a c-axis of the III-nitride semiconductor toward a first crystal axis; the first crystal axis is either one of m-axis and a-axis of the III-nitride semiconductor. The reference axis is inclined at a second angle ALPHA2 in a range of not less than −0.30 degrees and not more than +0.30 degrees with respect to the c-axis of the III-nitride semiconductor toward a second crystal axis; and the second crystal axis being another of the m-axis and a-axis. The predetermined angle, the first angle, and the second angle have a relation of ALPHA= $(ALPHA1^2+ALPHA2^2)^{1/2}$. A morphology of an outermost surface of the epitaxial semiconductor region includes plural pits, and a pit density of the pits being not more than $5\times10^4$ cm$^{-2}$.

Another aspect of the present invention is an epitaxial substrate for a III-nitride semiconductor device. This epitaxial substrate comprises: (a) a substrate comprising a III-nitride semiconductor and having a primary surface which extends along a first reference plane perpendicular to a reference axis inclined at a predetermined angle ALPHA with respect to a c-axis of the III-nitride semiconductor; and (b) an epitaxial semiconductor region provided on the primary surface of the substrate. The epitaxial semiconductor region comprises plural GaN-based semiconductor layers. The reference axis is inclined at a first angle ALPHA1 in a range of not less than 10 degrees and less than 80 degrees with respect to the c-axis of the III-nitride semiconductor toward a first crystal axis, and the first crystal axis is either one of m-axis and a-axis of the III-nitride semiconductor. The reference axis is inclined at a second angle ALPHA2 in a range of not less than −0.30 degrees and not more than +0.30 degrees with respect to the c-axis of the III-nitride semiconductor toward a second crystal axis, and the second crystal axis is another of the m-axis and a-axis. The predetermined angle, the first angle, and the second angle have a relation of ALPHA= $(ALPHA1^2+ALPHA2^2)^{1/2}$. A morphology of an outermost surface of the epitaxial semiconductor region includes plural pits, and a pit density of the pits being not more than $5\times10^4$ cm$^{-2}$.

In the III-nitride semiconductor device and the epitaxial substrate according to the foregoing aspects, the value of the second angle ALPHA2 is in the range of not less than −0.30 degrees and not more than +0.30 degrees. In the epitaxial semiconductor region provided on the underlying semipolar surface, the above configuration suppresses the pit creation and the pit expansion that are caused by slight variation in the inclination direction of the c-axis with respect to the foregoing crystal axis. Hence, the semipolar epitaxial film of the epitaxial semiconductor region is provided with an excellent surface morphology.

Still another aspect of the present invention is a method for fabricating a III-nitride semiconductor device. This method comprises: (a) preparing a substrate comprising a III-nitride semiconductor and having a primary surface which along a first reference plane perpendicular to a reference axis inclined at a predetermined angle ALPHA with respect to a c-axis of the III-nitride semiconductor; and (b) growing an epitaxial semiconductor region, which comprises plural GaN-based semiconductor layers, on the primary surface of the substrate. The epitaxial semiconductor region comprises the GaN-based semiconductor layers. The reference axis is inclined at a first angle ALPHA1 in a range of not less than 10 degrees and less than 80 degrees with respect to the c-axis of the III-nitride semiconductor toward a first crystal axis; the first crystal axis is either one of m-axis and a-axis of the III-nitride semiconductor. The reference axis is inclined at a second angle ALPHA2 in a range of not less than −0.30 degrees and not more than +0.30 degrees with respect to the c-axis of the III-nitride semiconductor toward a second crystal axis, and the second crystal axis is the other of the m-axis and a-axis. The predetermined angle, the first angle, and the second angle have a relation of $ALPHA=(ALPHA1^2+ALPHA2^2)^{1/2}$. A morphology of an outermost surface of the epitaxial semiconductor region includes a plurality of pits, and a pit density of the pits is not more than $5\times10^4$ cm$^{-2}$.

According to this aspect, the value of the second angle ALPHA2 is in the range of not less than −0.30 degrees and not more than +0.30 degrees. In the growth of the epitaxial semiconductor region on the underlying semipolar plane, this suppresses the pit creation and the pit expansion that are caused by slight variation in the inclination direction of the c-axis with respect to the aforementioned crystal axis. Hence, an excellent surface morphology is provided to the semipolar epitaxial film in fabrication of the III-nitride semiconductor device.

In the invention according to the foregoing aspects, at an opening of each of the pits, a first width of the opening in a first direction of a line of intersection of the pit and a second reference plane, which is defined by the c-axis of the III-nitride semiconductor and the first crystal axis, is smaller than a second width of the opening in a second direction perpendicular to the first direction. According to this invention, the shape of the pits in the semipolar surface is different from that of pits in a c-plane. The pits in the semipolar surface of the epitaxial film have an asymmetric shape, which has a horizontally long or vertically long shape with a large aspect ratio. Hence, the pits in the semipolar surface occupy a large area in the epitaxial film surface, and thus the reduction in the pit density is effective in enlargement of an excellent morphology surface.

In the invention according to the foregoing aspects, a thickness of the epitaxial semiconductor region is not less than 2 μm. According to this invention, the cause of the pits in the semipolar surface are considered to be growth anomalies originating from crystal defects such as threading dislocations. When the thickness of the epitaxial semiconductor region is around the foregoing value, the frequency of growth anomalies comes to affect the increase in the pit density. Most of growth anomalies induce morphology anomalies in the outermost surface of the epitaxial semiconductor region. Some of the above threading dislocations are succeeded, for example, by the underlying nitride region.

In the invention according to the above aspects, some of the plurality of pits have a depth of not less than 100 nm. According to this invention, the pits are made such that growth anomalies are succeeded to the surface of the epitaxial semiconductor region during the growth. Deep pits affect the electrical characteristics of the semiconductor device.

In the invention according to the foregoing aspects, the first angle can be not less than 63 degrees and be less than 80 degrees. According to this invention, the pit density tends to increase in the surface of the epitaxial semiconductor region in the foregoing angle range, when compared with other angle ranges.

In the invention according to the foregoing aspects, the second angle is preferably in the range of not less than −0.10 degrees and not more than +0.10 degrees. According to this invention, when the second angle is in the foregoing range, it is suitable for reduction in the pit density.

In the invention according to the foregoing aspects, the pit density can be not more than $5\times10^3$ cm$^{-2}$. According to the invention, the epitaxial semiconductor region can be provided with the excellent pit density.

In the invention according to the foregoing aspects, the epitaxial semiconductor region comprises an InGaN layer, and the first angle can be not less than 70 degrees and be less than 80 degrees. According to this invention, the InGaN layer can be made in a high indium composition, and the pit density can be reduced in this InGaN layer.

In the invention according to the foregoing aspects, the first angle can be not less than 72 degrees and be less than 78 degrees. According to this invention, the InGaN layer can be made in a high indium composition and low indium segregation, and the pit density can be reduced in this InGaN layer.

The III-nitride semiconductor device according to the foregoing aspect can further comprise an electrode in contact with the epitaxial semiconductor region. According to this invention, the III-nitride semiconductor device can be provided with the electrode in which the current leakage due to the pits is reduced.

In the invention according to the foregoing aspects, the epitaxial semiconductor region can comprise a first conductivity type GaN-based semiconductor layer, a second conductivity type GaN-based semiconductor layer, and a light emitting layer, and the light emitting layer can be provided between the first conductivity type GaN-based semiconductor layer and the second conductivity type GaN-based semiconductor layer. According to this invention, each pit composes certain facets in the growth of the epitaxial semiconductor region, and the GaN-based semiconductor for the epitaxial semiconductor region is also grown on the facets of the pit as well as on the usual growth surface. Since incorporation of constituent elements into the facets is different from incorporation of the constituent elements into the usual growth surface, the composition of the constituent element varies near the pit. Particularly, since incorporation of a constituent element (e.g., indium) into the facets is different from incorporation into the usual growth surface during the growth of the light emitting layer, the composition of the constituent element varies near the pit and this increases the full width at half maximum in an emission spectrum.

In the invention according to the foregoing aspects, the III-nitride semiconductor of the support base or the substrate is preferably GaN. According to this invention, the epitaxial semiconductor region can be provided on the GaN region, and deterioration of crystal quality except for the pit density can be reduced.

In the invention according to the foregoing aspects, the dislocation density in the support base or the substrate is preferably not more than $1\times10^6$ cm$^{-2}$. This invention can reduce creation of pits originating from the dislocation density of the support base or the substrate.

The fabrication method of the III-nitride semiconductor device according to the still other aspect of the present invention can further comprise a step of forming an electrode in contact with the epitaxial semiconductor region.

This method reduce the pit density, thereby reducing the number of pits located immediately below the electrode.

BRIEF DESCRIPTION OF THE DRAWINGS

The above object and other objects, features, and advantages of the present invention will more readily become clear in view of the following detailed description of the preferred embodiments of the present invention proceeding with reference to the accompanying drawings.

DETAILED DESCRIPTION OF THE PREFERRED EMBODIMENTS

The expertise of the present invention can become readily understood in view of the following detailed description with reference to the accompanying drawings presented by way of illustration. Embodiments of the III-nitride semiconductor device and epitaxial substrate, and the method of fabricating the III-nitride semiconductor device and epitaxial substrate according to the present invention will be described below with reference to the accompanying drawings. The same portions will be denoted by the same reference signs, if possible.

Figure 1:
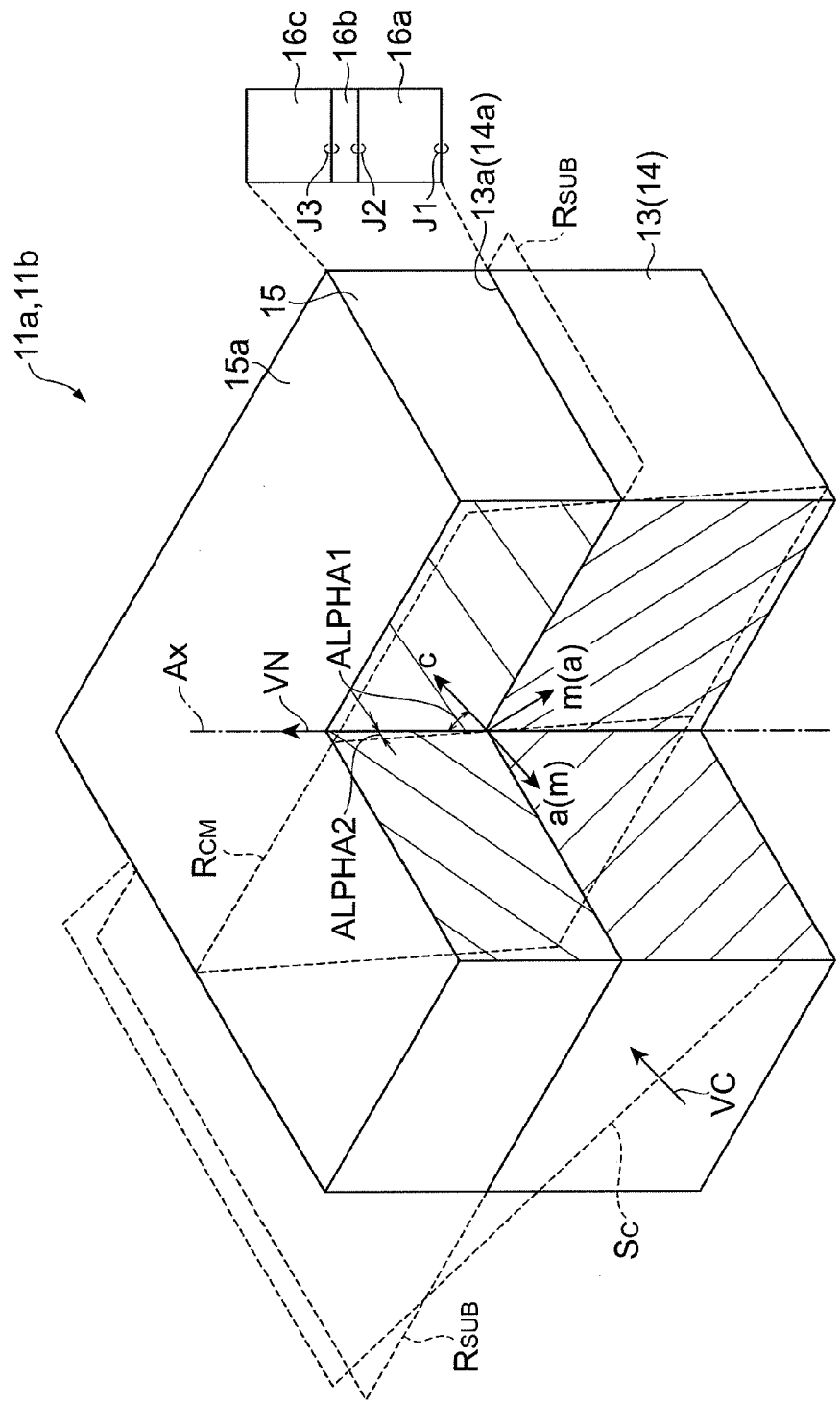
FIG. 1 is a drawing schematically showing elements common to a III-nitride semiconductor device and an epitaxial substrate according to an embodiment of the present invention.

FIG. 1 is a drawing schematically showing constituents common to a III-nitride semiconductor device and an epitaxial substrate according to an embodiment of the present invention. The III-nitride semiconductor device 11a has a support base 13 and an epitaxial semiconductor region 15, and in the epitaxial substrate 11b, a substrate 14 is used instead of the support base 13. In the description hereinafter, the III-nitride semiconductor device 11a and epitaxial substrate 11b will be described with reference to the III-nitride semiconductor device 11a. The support base 13 comprises a III-nitride semiconductor and can be made, for example, of GaN, InGaN, AlGaN, AlN or the like. The support base 13 has a primary surface 13a and a back surface 13b, and the back surface 13b is opposite to the primary surface 13a. The primary surface 13a of the support base 13 extends along a first reference plane $R_{SUB}$, which is perpendicular to a reference axis Ax inclined at a predetermined angle ALPHA with respect to the c-axis of the III-nitride semiconductor. The reference axis Ax is inclined at a first angle ALPHA1 in the range of not less than 10 degrees and less than 80 degrees with respect to the c-axis of the III-nitride semiconductor toward a first crystal axis (e.g., the m-axis), either one of the m-axis and a-axis. Accordingly, the primary surface 13a demonstrates semipolar characteristics. The reference axis Ax has a second angle ALPHA2 in the range of not less than −0.30 degrees and not more than +0.30 degrees with respect to the c-axis of the III-nitride semiconductor toward another crystal axis (e.g., the a-axis), the other of the m-axis and a-axis. A second reference plane $R_{CM}$ is defined by the c-axis and the crystal axis (e.g., the m-axis) of the III-nitride semiconductor. A typical c-plane Sc is depicted in FIG. 1, and a c-axis vector VC indicating the c-axis direction is also depicted. In the present embodiment, the reference axis Ax extends in a direction of an axis normal to the primary surface 13a, and is shown together with a normal vector VN.

The epitaxial semiconductor region 15 is provided on the primary surface 13a of the support base 13. A morphology of an outermost surface 15a of the epitaxial semiconductor region 15 includes plural pits and a pit density of the pits is not more than $5\times10^4$ cm$^{-2}$. In the present embodiment, the reference axis Ax extends along a direction of an axis normal to the outermost surface 15a. In the present embodiment, the epitaxial semiconductor region 15 can include, for example, plural GaN-based semiconductor layers 16a, 16b and 16c. The GaN-based semiconductor layer 16a makes a junction J1 with the support base 13; the GaN-based semiconductor layer 16b makes a junction J2 with the GaN-based semiconductor layer 16a; and the GaN-based semiconductor layer 16c makes a junction J3 with the GaN-based semiconductor layer 16b. The GaN-based semiconductor layers 16a, 16b and 16c are epitaxial films grown in order on the support base 13.

In the III-nitride semiconductor device 11a, the value of the second angle ALPHA2 is in the range of not less than −0.30 degrees and not more than +0.30 degrees. In growth of the epitaxial semiconductor region 15 on the underlying surface of a semipolar plane, this configuration can suppress the generation of pits, which are formed due to slight variation in the inclination direction of the c-axis with respect to the aforementioned crystal axis. Hence, an excellent surface morphology is provided to the surface 15a of the semipolar epitaxial film in fabrication of the III-nitride semiconductor device 11a and the epitaxial substrate 11b.

In the III-nitride semiconductor device 11a, the III-nitride semiconductor of the support base 13 (similarly, the substrate of the epitaxial substrate) is preferably GaN. The epitaxial semiconductor region can be provided on the GaN region, and deterioration of crystal quality except for the pit density can be reduced thereby. A dislocation density of the support base 13 (similarly, the substrate of the epitaxial substrate) is preferably not more than $1\times10^6$ cm$^{-2}$. This can reduce generation of pits due to the dislocation density of the support base or the substrate.

Figure 2:
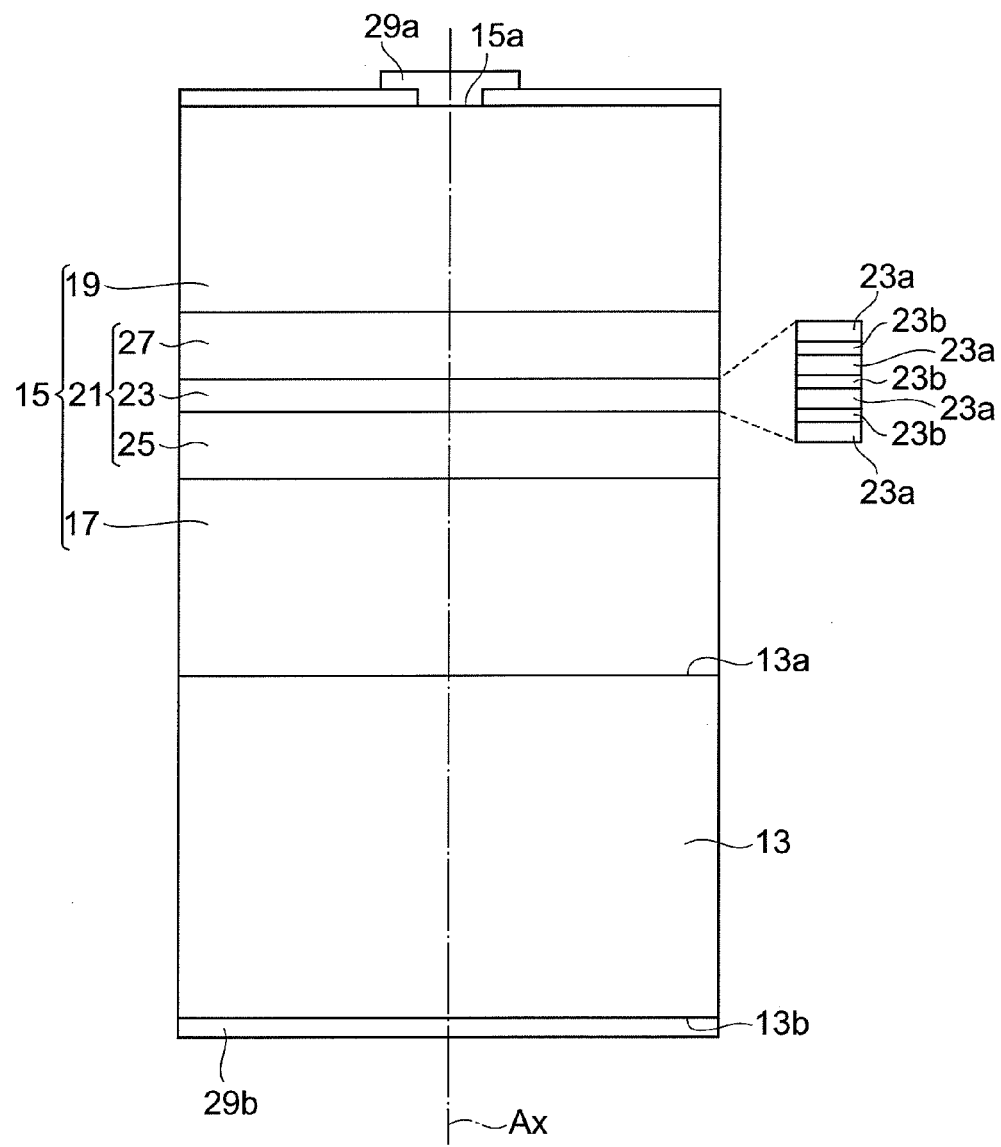
FIG. 2 is a drawing schematically showing a structure of a light emitting device as a III-nitride semiconductor device.

FIG. 2 is a drawing schematically showing a structure of a light emitting device such as the III-nitride semiconductor device 11a. The light emitting device can be, for example, a laser diode or a light emitting diode. When the III-nitride semiconductor device 11a is a light emitting device, as shown in FIG. 2, the epitaxial semiconductor region 15 includes a first conductivity type GaN-based semiconductor layer 17, a second conductivity type GaN-based semiconductor layer 19 and a light emitting layer 21. The light emitting layer 21 can be provided between the first conductivity type GaN-based semiconductor layer 17 and the second conductivity type GaN-based semiconductor layer 19. The first conductivity type GaN-based semiconductor layer 17 can include, for example, an n-type cladding layer, and the n-type cladding layer can comprise, for example, GaN, AlGaN, InAlGaN, or the like. The second conductivity type GaN-based semiconductor layer 19 can include a p-type cladding layer, and the p-type cladding layer can comprise, for example, GaN, AlGaN, InAlGaN, or the like. The light emitting layer 21 can include, for example, an active layer 23 of a quantum well structure, and if needed, the light emitting layer 21 can include an optical guiding layer 25 provided between the first conductivity type GaN-based semiconductor layer 17 and the active layer 23. The optical guiding layer 25 can comprise, for example, a GaN layer and/or an InGaN layer. The light emitting layer 21 can include an optical guiding layer 27 provided between the second conductivity type GaN-based semiconductor layer 19 and the active layer 23, and the optical guiding layer 27 can comprise, for example, a GaN layer and/or an InGaN layer. The active layer 23 can include barrier layers 23a and well layers 23b, which are alternately arranged in the direction of the reference axis Ax. The well layers 23b can comprise, for example, InGaN layers, and the barrier layers 23a can comprise, for example, GaN or InGaN layers.

In growth of the epitaxial semiconductor region 15, each pit is composed of certain facets, and a GaN-based semiconductor for the epitaxial semiconductor region 15 is also grown on the facets of the pits as well as on the usual growth surface. Since incorporation of constituent elements into the facets is different from that in the usual growth surface, the composition of the constituent elements varies in the vicinity of the pits. Particularly, since incorporation of a constituent element (e.g., indium) into the facets is different from the incorporation into the usual growth surface in the growth of the light emitting layer 21, the composition of the constituent element varies in the vicinity of the pits, and this increases the full width at half maximum in an emission spectrum.

The III-nitride semiconductor device 11a includes an electrode 29a provided on the surface 15a of the epitaxial semiconductor region 15, and the electrode 29a can be an anode in contact with a contact layer constituting the uppermost layer 15a of the epitaxial semiconductor region 15. The reduction in the pit density can provide the III-nitride semiconductor device 11a with the electrode 29a in which a leak current due to the pits is reduced. Furthermore, it is also feasible to provide the epitaxial substrate capable of providing the III-nitride semiconductor device 11a with the electrode 29a capable of reducing the leak current due to the pits. The uppermost layer 15a of the epitaxial semiconductor region 15 demonstrates an excellent surface morphology that allows the reduction in the leak current.

The III-nitride semiconductor device 11a includes an electrode 29b provided on the back surface 13b of the support base 13, and the electrode 29b can be a cathode.

At an opening of each pit in the uppermost layer 15a of the epitaxial semiconductor region 15, a first width of the opening in a first direction defined by the line of intersection of the pit and the reference plane $R_{CM}$ is smaller than a second width of the opening in a second direction perpendicular to the first direction. The pits in a semipolar surface have a shape different from that of pits in a c-plane. The pit shape in the semipolar surface of the epitaxial film is asymmetric and is a horizontally long or vertically long shape having a large aspect ratio, which is larger than one. Hence, the pits in the semipolar surface affect a large area in the surface of the epitaxial film and therefore the reduction in the pit density is effective in increasing the available area of the surface that has an excellent morphology.

The thickness of the epitaxial semiconductor region 15 is not less than 2 μm. The aforementioned pits in the semipolar surface are considered to be formed by growth anomalies from crystal defects such as threading dislocations. When the thickness of the epitaxial semiconductor region 15 is approximately the foregoing value, the frequency of these growth anomalies affect the pit density to come to the increase thereof. Many of growth anomalies induce morphology anomalies in the uppermost surface 15a of the epitaxial semiconductor region 15, which succeeds some of threading dislocations from, for example, the underlying nitride region.

Some of the pits have a depth of not less than 100 nm. Growth anomalies are succeeded to the surface 15a of the epitaxial semiconductor region 15 during the growth to make the pits therein. The deep pits affect the electrical characteristics of the semiconductor device.

The first angle ALPHA1 can be not less than 63 degrees and be less than 80 degrees. In the surface 15a of the epitaxial semiconductor region 15 in this angle range, the pit density tends to increase, when compared with other angle ranges. The epitaxial semiconductor region can include an InGaN layer such as the well layers. The first angle ALPHA1 can be not less than 70 degrees and be less than 80 degrees. It permits production of the InGaN layer with a high indium composition and reduction in the pit density in the InGaN layer. Furthermore, the first angle ALPHA1 can be not less than 72 degrees and be less than 78 degrees. It permits reduction in the pit density in the InGaN layer and production of the InGaN layer with a high indium composition and a low indium segregation.

The second angle ALPHA2 is preferably in the range of not less than −0.10 degrees and not more than +0.10 degrees. When the second angle is in the foregoing range, it is suitable for the reduction in the pit density. When the pit density is not more than $5\times10^3$ cm$^{-2}$, the epitaxial semiconductor region 15 is provided with the excellent pit density.

Figure 3:
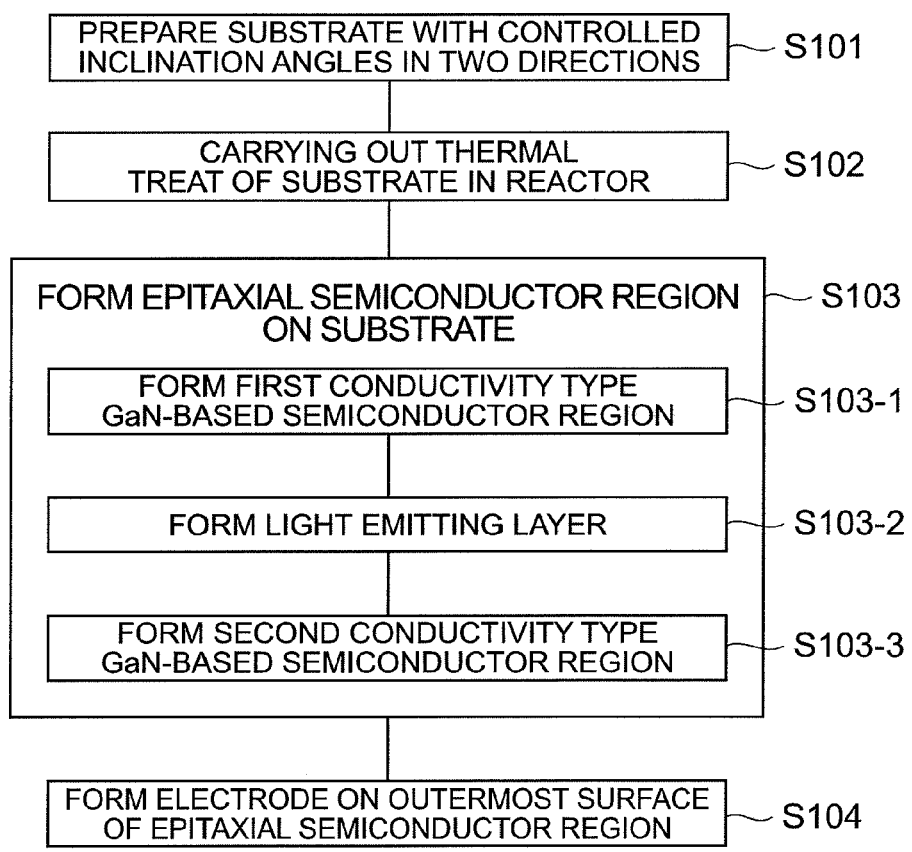
FIG. 3 is a drawing showing a step flow including major steps in a method for fabricating a III-nitride semiconductor device according to an embodiment.
Figure 4:
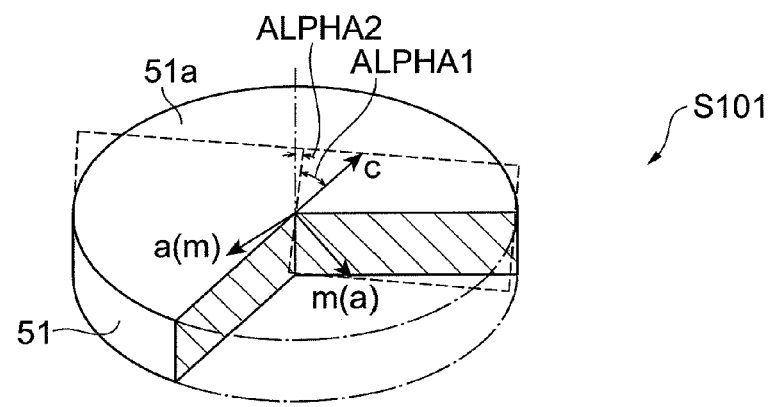
FIG. 4 is a drawing schematically showing the major steps in the method for fabricating the III-nitride semiconductor device according to the embodiment.
Figure 4:
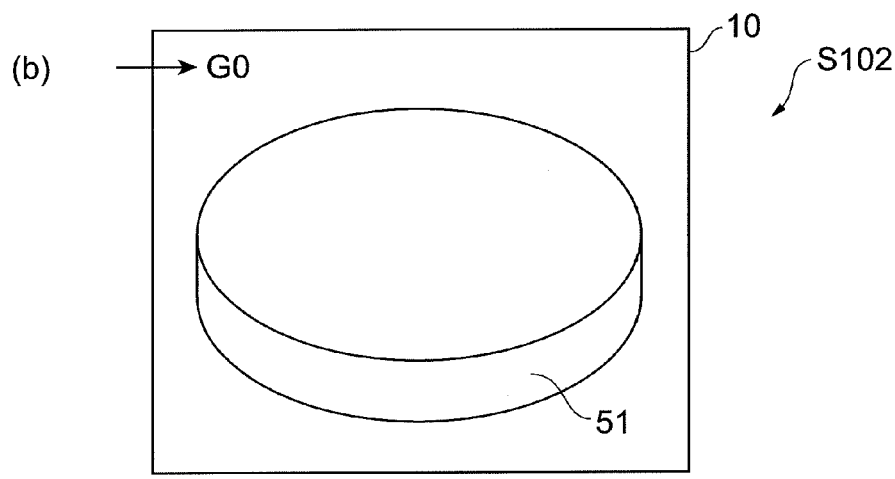
Figure 4:
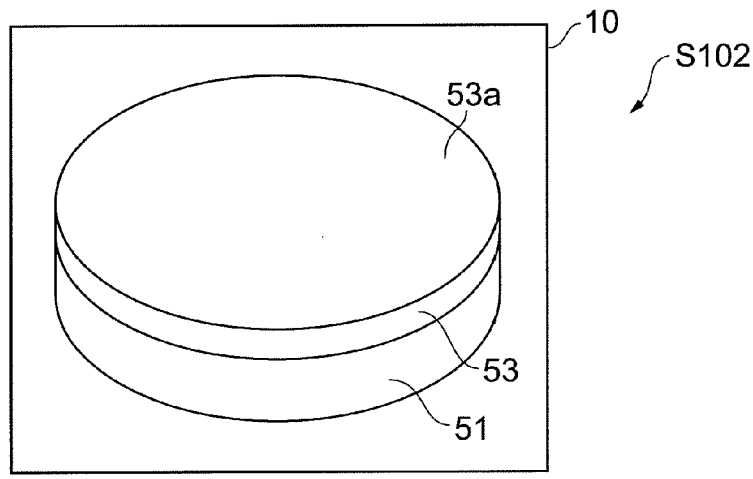

FIG. 3 is a drawing showing a step flow including major steps in a method of fabricating a III-nitride semiconductor device according to an embodiment of the present invention. FIG. 4 is a drawing schematically showing the major steps in the method of fabricating the III-nitride semiconductor device according to the present embodiment.

In Step S101, a substrate 51 is prepared as shown in part (a) of FIG. 4. The substrate 51 is made of III-nitride semiconductor. The primary surface 51a of the substrate 51 extends along the reference plane that is perpendicular to the reference axis Ax inclined with respect to the c-axis of the III-nitride semiconductor. The reference axis Ax is inclined at the first angle ALPHA1 with respect to the c-axis of the III-nitride semiconductor toward either one crystal axis of the m-axis and a-axis, and the first angle ALPHA1 is in the range of not less than 10 degrees and less than 80 degrees. The reference axis Ax is inclined at the second angle ALPHA2 with respect to the c-axis of the III-nitride semiconductor toward the other crystal axis of the m-axis and a-axis, and the second angle ALPHA2 is in the range of not less than −0.30 degrees and not more than +0.30 degrees. The predetermined angle ALPHA, the first angle ALPHA1, and the second angle ALPHA2 satisfy the relation of $ALPHA=(ALPHA1^2+ALPHA2^2)^{1/2}$. In the description hereinafter, a GaN substrate (referred to as "substrate 51" in the description hereinafter) is used as an example of the substrate 51.

In step S102, the substrate 51 is placed in a reactor 10 and, as shown in part (b) of FIG. 4, thermal cleaning of the GaN substrate 51 is carried out using the reactor 10. At the temperature of 1050 Celsius degrees, while gas G0 containing $NH_3$ and $H_2$ is supplied to the reactor 10, a thermal treatment is carried out for ten minutes.

A number of GaN-based semiconductor layers are then grown on the substrate 51 by metal-organic vapor phase epitaxy to produce an epitaxial substrate. Raw materials used are trimethyl gallium (TMG), trimethyl aluminum (TMA), trimethyl indium (TMI), and ammonia ($NH_3$). Dopant gases used are silane ($SiH_4$) and bis(cyclopentadienyl) magnesium ($Cp_2Mg$).

In step S103, as shown in part (c) of FIG. 4, an epitaxial semiconductor region 53 is grown on the primary surface 51a of the substrate 51. The epitaxial semiconductor region 53 can include, for example, a single GaN-based semiconductor layer or plural GaN-based semiconductor layers. As seen from the description hereinafter, morphology of an outermost surface 53a of the epitaxial semiconductor region 53 includes plural pits, and the pit density is not more than $5 \times 10^4$ $cm^{-2}$.

These steps result in producing the epitaxial substrate 11b for the III-nitride semiconductor device. This epitaxial substrate 11b has the substrate 14 and the epitaxial semiconductor region 15, as shown in FIG. 1. The substrate 14 comprises III-nitride semiconductor and the primary surface 14a thereof extends along the reference plane $R_{SUB}$ that is perpendicular to the reference axis Ax inclined at the predetermined angle ALPHA with respect to the c-axis of the III-nitride semiconductor. The epitaxial semiconductor region 15 is provided on the primary surface 14a of the substrate 14. The reference axis Ax is inclined at the first angle ALPHA1 in the range of not less than 10 degrees and less than 80 degrees from the c-axis of the III-nitride semiconductor toward a first crystal axis, which is either one of the m-axis and a-axis. The reference axis Ax is inclined at the second angle ALPHA2 in the range of not less than −0.30 and not more than +0.30 degrees from the c-axis of the III-nitride semiconductor toward a second crystal axis, which is the other of the m-axis and a-axis. The predetermined angle, the first angle, and the second angle satisfy the relation: $ALPHA=(ALPHA1^2+ALPHA2^2)^{1/2}$. The morphology of the outermost surface 15a of the epitaxial semiconductor region 15 includes plural pits, and regarding these pits, the pit density is not more than $5 \times 10^4$ $cm^{-2}$.

Figure 5:
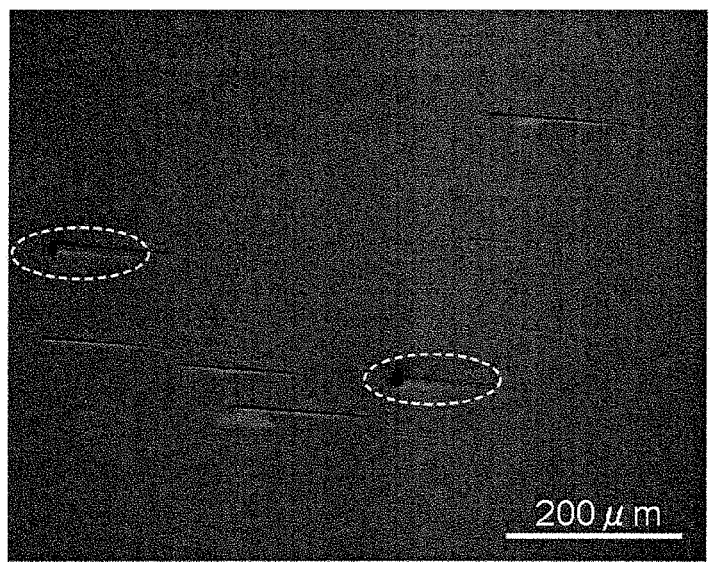
FIG. 5 is a drawing showing pits appearing in an outermost surface of a GaN epitaxial film on a semipolar plane.
Figure 5:
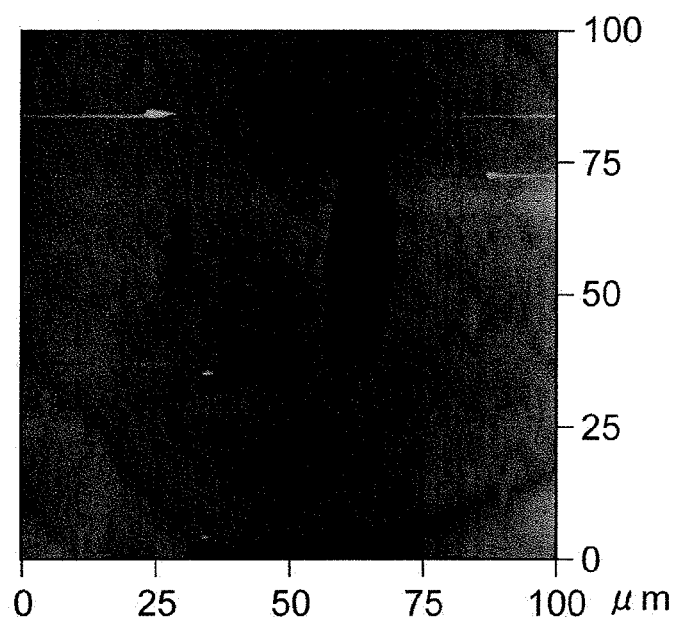

FIG. 5 is a drawing showing pits observed in an outermost surface of a GaN epitaxial film on a semipolar substrate. With reference to part (a) of FIG. 5, morphology of pits is shown together with the scale of 200 μm. As shown in part (b) of FIG. 5, morphology anomalies are observed and have a depressed shape asymmetrically grown in one direction from origins of lattice defects such as dislocations. In part (b) of FIG. 5, the scale of 100 μm is shown on the vertical axis and on the horizontal axis. The sizes of openings of the pits range approximately from several ten μm to several hundred μm.

Figure 6:
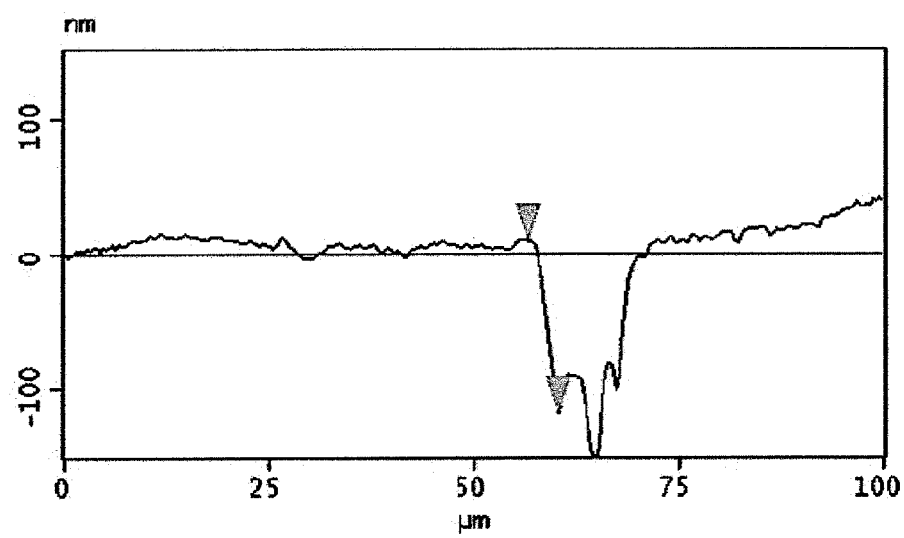
FIG. 6 is a drawing showing pits appearing in an outermost surface of a GaN epitaxial film on a semipolar plane.
Figure 6:
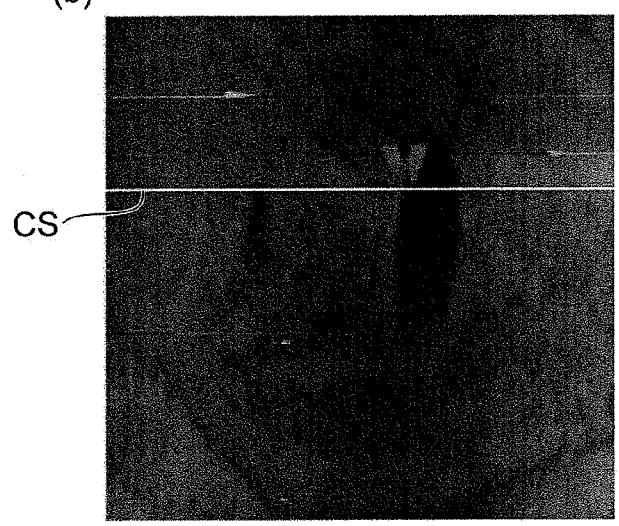

FIG. 6 is a drawing showing pits observed in an outermost surface of a GaN epitaxial film on a semipolar substrate. With reference to part (a) of FIG. 6, there is shown a shape of a cross section of a pit formed in the outermost surface of the epitaxial film. This cross section is taken along a line CS shown in part (b) of FIG. 6. The depth of the pit is not less than 100 nm, and deeper pits of about several μm are also observed. Since the openings of the pits have large aspect ratios, the pits in the epitaxial film formed on the semipolar surface occupy a larger area of its surface than pits formed in an epitaxial film on a c-plane surface.

Example 1

Figure 7:
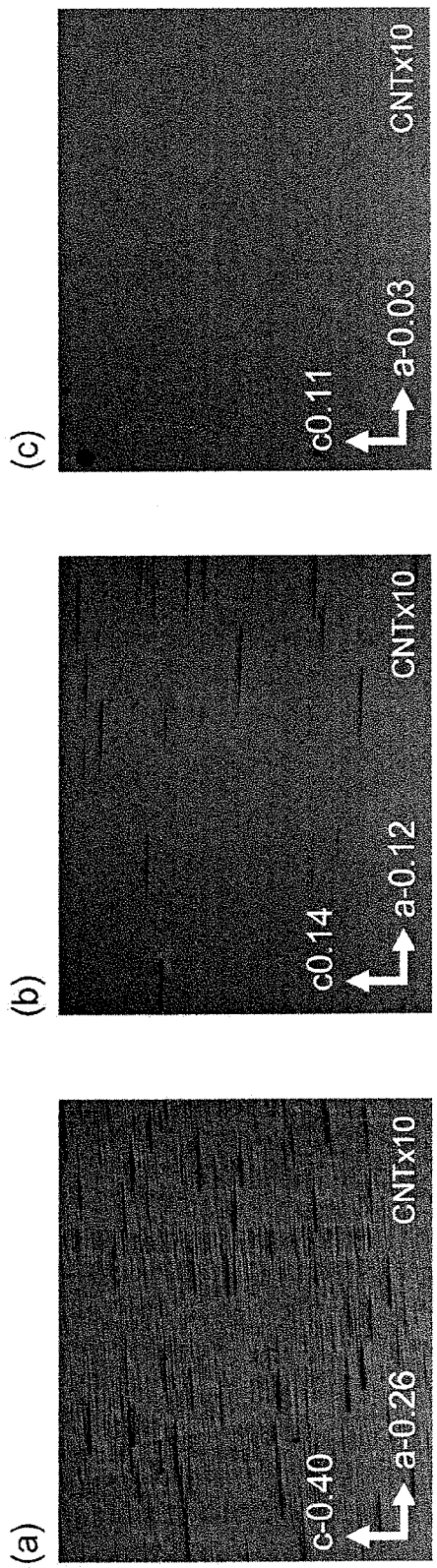
FIG. 7 is a drawing showing surface morphologies of GaN epitaxial films grown on GaN substrates with primary surfaces of some second angles.

FIG. 7 is a drawing showing surface morphologies of GaN epitaxial films grown on GaN substrates with primary surfaces having a number of second angles. Three types of GaN substrates S1, S2 and S3 are prepared. These GaN substrates have a GaN primary surface inclined at the angle of 75 degrees from the c-plane of hexagonal GaN toward the m-axis direction, and this inclined surface is represented as a (20-21) plane. All the primary surfaces are mirror-polished.
Photograph of appearance; GaN substrate: Second angle (toward a-axis); First angle −75.09 (from c-axis to m-axis).
Part (a) of FIG. 7; GaN substrate S1: −0.26; −4.0.
Part (b) of FIG. 7; GaN substrate S2: −0.12; +4.0.
Part (c) of FIG. 7; GaN substrate S3: −0.03; +0.03.
The unit of angle is "degrees."

In addition to the experiment of the GaN epitaxial films shown in FIG. 7, various experiments show that the morphology becomes better with decrease in slight angular deviation toward the a-axis direction. The surface morphology of GaN is not sensitive to an angular deviation of the c-axis direction which is equivalent to the slight angular deviation toward the a-axis direction.

According to Inventors' experiment, the second angle ALPHA2 can be in the range of not less than −0.30 degrees and not more than +0.30 degrees. When the second angle is in the above range, the pit density is reduced. When the pit density is not more than $5 \times 10^4$ $cm^{-2}$, the outermost surface of the GaN-based epitaxial semiconductor region can be provided with a low pit density.

According to Inventors' experiment, the second angle ALPHA2 is preferably in the range of not less than −0.10 degrees and not more than +0.10 degrees. When the second angle is in the foregoing range, it is suitable for reduction in the pit density. When the pit density is not more than $5 \times 10^3$ $cm^{-2}$, the outermost surface of the GaN-based epitaxial semiconductor region is provided with an excellent pit density.

Figure 8:
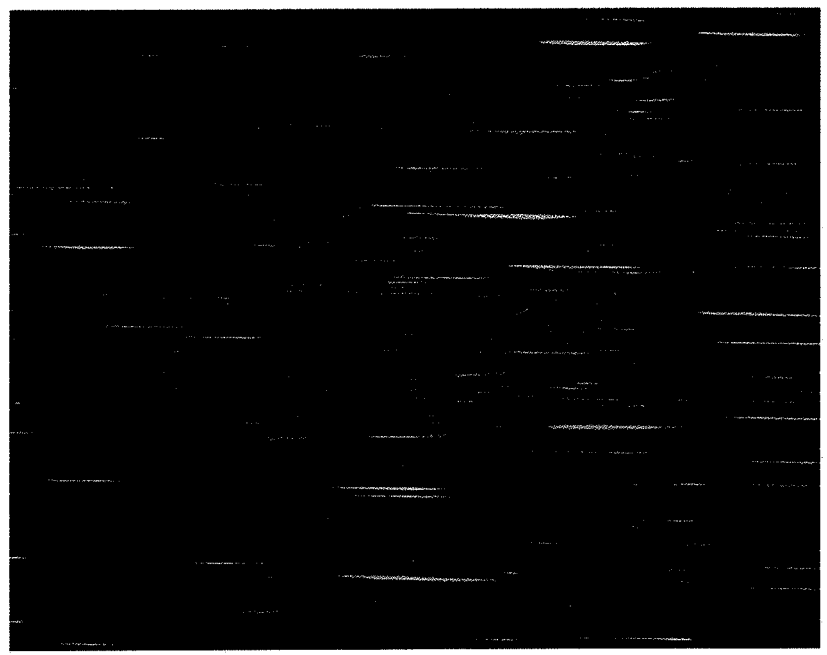
FIG. 8 is a drawing showing the surface distribution of emission of a GaN-based epitaxial semiconductor region including an InGaN layer.
Figure 8:
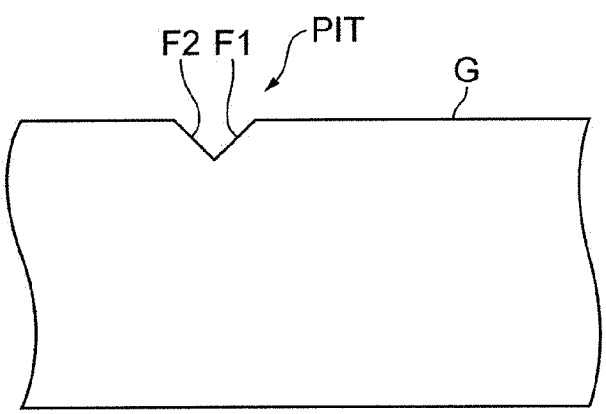

FIG. 8 is a drawing showing a surface distribution of emission in a GaN-based epitaxial semiconductor region including an InGaN layer. With reference to part (a) of FIG. 8, it is shown that a slight difference of emission wavelength is made in the surface of the GaN-based epitaxial semiconductor region, and the emission unevenness is coincident with positions of horizontally long pits. Part (b) of FIG. 8 is a drawing schematically showing a cross section of a pit PIT. Side faces of a depressed part of the pit are composed of facets F1 and F2. Incorporation of indium into the facets F1 and F2 is different from incorporation of indium into a primary growth surface G, and therefore the emission wavelength in a part abnormal in the surface morphology is different from that in a part normal in the surface morphology. Accordingly, the full width at half maximum of emission wavelength increases in the emission spectrum. Furthermore, the emission wavelength also differs depending upon the difference of the facets in the depressed part of the pit. Accordingly, the full width at half maximum of emission wavelength further increases in the emission spectrum.

Figure 9:
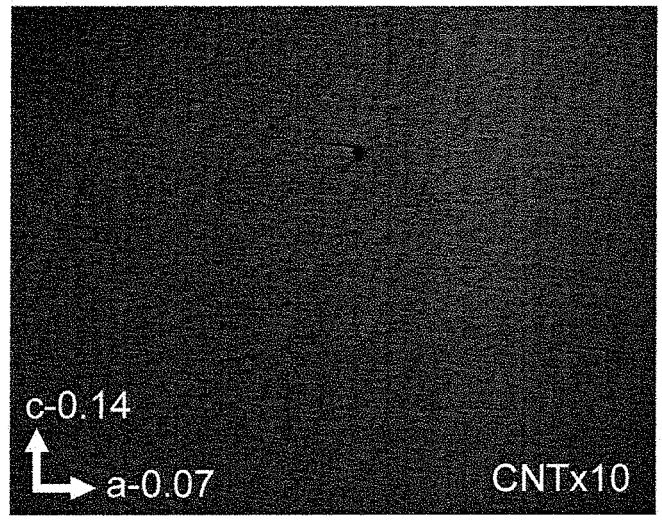
FIG. 9 is a drawing showing surface morphologies of GaN epitaxial films with change in growth temperature.
Figure 9:
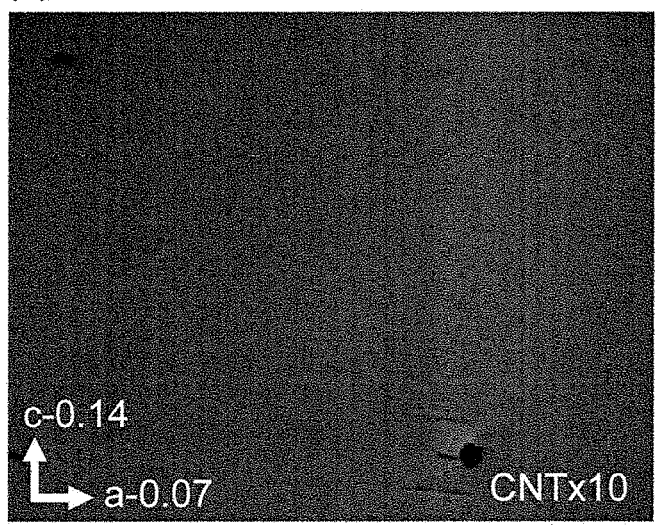

As shown in the surface morphology of FIG. 9, randomness of directions in which kinks extend enhances with decrease in growth temperature. This makes morphology anomalies due to the pits less likely to occur, and thus improves the GaN surface morphology.

Photograph of appearance; GaN substrate: Second angle (toward a-axis); First angle −75.09 (from c-axis to m-axis), Growth temperature.

Part (a) of FIG. 9; GaN substrate S1: −0.07; −0.14; 1050 Celsius degrees.

Part (b) of FIG. 9; GaN substrate S2: −0.07; −0.14; 950 Celsius degrees.

The unit of angle is "degrees."

According to Inventors' experiment, when the thickness of the epitaxial semiconductor region is not less than 2 μm, generation of pits becomes prominent in the semipolar surface. But, if the thickness of the epitaxial semiconductor region is less than 2 μm, a number of pits are generated. When the thickness of the epitaxial semiconductor region 15 becomes approximately the foregoing value, the frequency of growth anomalies is considered to come to affect the increase in pit density. Many of growth anomalies induce morphology anomalies in the outermost surface of the epitaxial semiconductor region. Some of threading dislocations are succeeded, for example, from the underlying nitride region. In the present example, the dislocation density of the GaN substrate is not more than $1 \times 10^6$ cm$^{-2}$.

Figure 10:
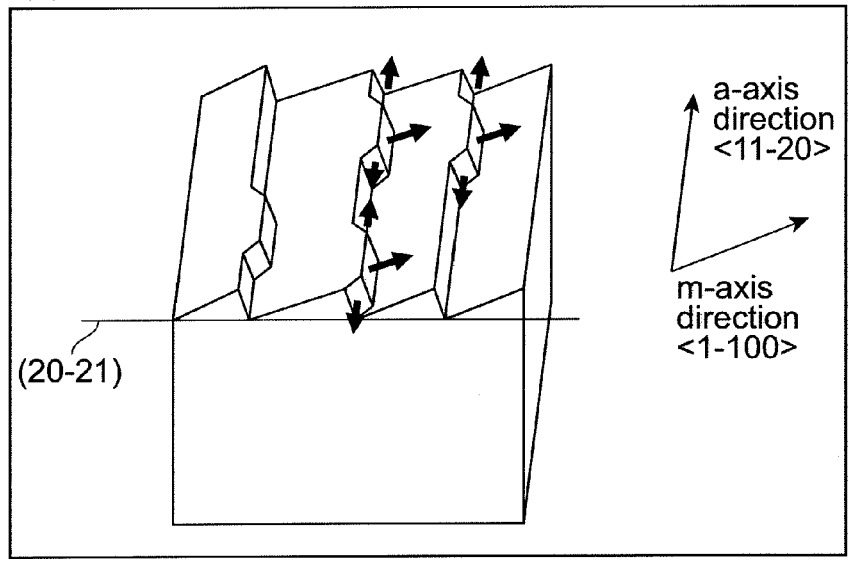
FIG. 10 is a drawing schematically showing growth of GaN on a semipolar surface, such as a (20-21)-face inclined at the angle of 75 degrees with respect to the c-axis toward the m-axis direction.
Figure 10:
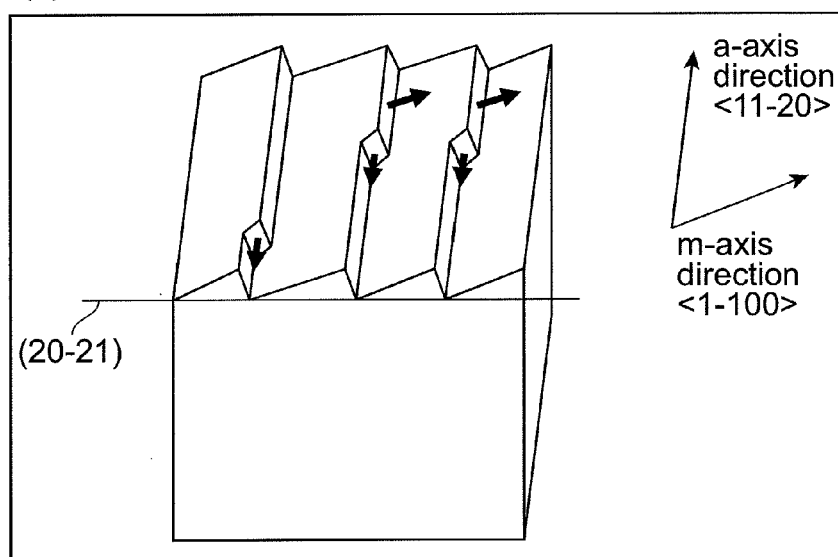

FIG. 10 is a drawing schematically showing growth of GaN on a semipolar surface, such as (20-21) plane inclined at the angle of 75 degrees with respect to the c-axis toward the m-axis. With reference to part (a) of FIG. 10, there is shown growth on a semipolar surface with a small angle ALPHA2. On the semipolar surface with the small angle ALPHA2, kinks extend in the <11-20> direction or in the <−1-120> direction. This results in the growth occurs such that steps grows in the <1-100> direction. In growth onto a semipolar surface with the inclination angle of the angle ALPHA2 toward the a-axis direction that is close to zero degrees, extending directions in which kinks grow during the growth become virtually random.

With reference to part (b) of FIG. 10, there is shown growth on semipolar surfaces with a number of large angle ALPHA2. When the inclination angle toward the a-axis direction is large over a certain level, kinks come to extend selectively in the direction of inclination of the a-axis. If anomalous growth occurs during this growth and originates from crystal defect such as threading dislocation derived from the substrate, the anomalies selectively grow to form pits each of which extends in one direction. This results in a morphology anomaly due to the pits.

As described above, when the inclination angle of the angle ALPHA2 toward the a-axis direction is close to zero degrees, pits are generated thereat, but these pits do not have asymmetric shapes formed so as to have openings of large aspect ratios, as shown in part (b) of FIG. 5; therefore, the pits do not have large influence on the surface morphology.

In the angle ALPHA1 different from 75 degrees, there is change in the directions in which the kinks and steps illustrated in the foregoing description extends, but morphology anomalies occur in the same mechanism. According to Inventors' experiment, the growth onto the semipolar surface is susceptible to the inclination of the angle ALPHA2, and the pits formed with inclination of relatively large angle ALPHA2 are peculiar to semipolar plane.

Figure 11:
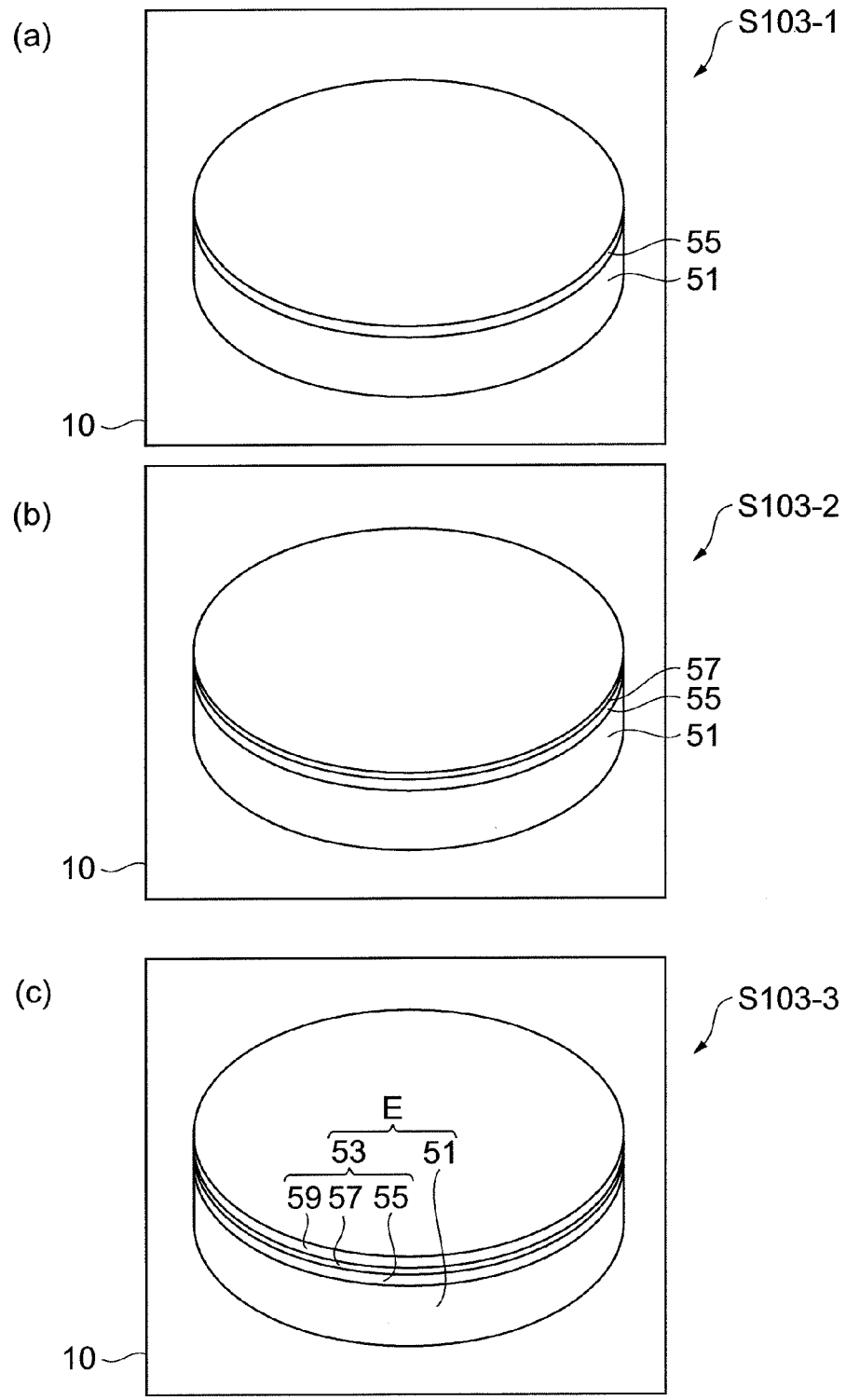
FIG. 11 is a drawing schematically showing major steps in a method for fabricating a III-nitride semiconductor light emitting device according to an embodiment of the present invention.

FIG. 11 is a drawing schematically showing major steps in a method of fabricating a III-nitride semiconductor light emitting device according to an embodiment of the present invention. The method of fabricating the semiconductor light emitting device will be described with reference to FIG. 11. As already described, in step S103, the epitaxial semiconductor region 53 is grown on the primary surface 51a of the substrate 51. First, step S103-1, an n-type GaN-based semiconductor region 55 is formed as shown in part (a) of FIG. 11. The formation of the n-type GaN-based semiconductor region 55 includes the growth of, for example, an n-type cladding layer and/or a buffer layer. The n-type cladding layer can comprise Si-doped AlGaN, InAlGaN, GaN or the like. The buffer layer can comprise InGaN or the like.

Next, step S103-2 is carried out to form a light emitting layer 57, as shown in part (b) of FIG. 11. The formation of the light emitting layer 57 includes the growth of an active layer of a quantum well structure. The well layers of the quantum well structure can comprise, for example, InGaN, and the barrier layers of the quantum well structure can comprise, for example, GaN or InGaN. Prior to the formation of the active layer, an optical guiding layer can be formed. The optical guiding layer can include, for example, a GaN layer and an InGaN layer and, if needed, a part of the optical guiding layer can be doped with an n-type dopant. Prior to formation of p-type GaN-based semiconductor region 59, an optical guiding layer can be formed. The optical guiding layer can include, for example, a GaN layer and an InGaN layer and, if needed, a part of the optical guiding layer can be doped with a p-type dopant. When the optical guiding layer comprises a plurality of semiconductor layers, an electron block layer can be provided in the optical guiding layer.

After the growth of the light emitting layer 57, the p-type GaN-based semiconductor region 59 is formed as shown in part (c) of FIG. 11. The formation of the p-type GaN-based semiconductor region 59 includes the growth of, for example, an electron block layer, a p-type cladding layer, and a p-type contact layer. The electron block layer can comprise an AlGaN layer. The p-type cladding layer can comprise Mg-doped AlGaN, InAlGaN, or the like. The p-type contact layer can comprise Mg-doped AlGaN, Mg-doped GaN, or the like. As a result, these steps can complete an epitaxial substrate E.

Step S104 is carried out to form an anode and a cathode on the epitaxial substrate E. In the present example, an electrode is formed to be in contact with the p-type contact layer, and after polishing the back surface of the substrate 51, an electrode is formed to be in contact with the polished surface.

Example 2

An epitaxial substrate for a laser diode structure (LD1) is produced on a GaN substrate having a semipolar primary surface. Raw materials used for the epitaxial growth are as follows: trimethyl gallium (TMG), trimethyl indium (TMI); trimethyl aluminum (TMA); ammonia (NH$_3$), silane (SiH$_4$); and bis(cyclopentadienyl) magnesium (Cp$_2$Mg).

The GaN substrate 120 is prepared and has an inclination angle in the inclination angle range of 63 degrees to 80 degrees. The GaN substrate 120 has a primary surface inclined at the angle of 75 degrees with respect to a plane perpendicular to the c-axis toward the m-axis direction in hexagonal GaN, and this inclined surface is represented by a (20-21) plane. The primary surface is inclined at the angle of 0.05 degrees toward the a-axis direction. This primary surface is also mirror-polished. Epitaxial growth is carried out on this substrate 120 under the following conditions.

First, the GaN substrate 120 is placed in a reactor. Thermal treatment is carried out for ten minutes under flow of $NH_3$ and $H_2$ at the temperature of 1050 Celsius degrees and the in-reactor pressure of 27 kPa. Surface modification by this thermal treatment results in forming a terrace structure, which depends upon an off-axis angle, in the surface of the GaN substrate 120. After this thermal treatment, a GaN-based semiconductor region is grown thereon. After a buffer layer 121a is grown, TMG, TMA, $NH_3$ and $SiH_4$ are supplied to the reactor, for example, at 1050 Celsius degrees to form an n-type cladding layer 121b. The n-type cladding layer 121b is, for example, a Si-doped AlGaN layer. The thickness of the AlGaN layer is, for example, 2 micrometers, and the Al composition thereof is, for example, 0.04.

Next, TMG TMI, and $NH_3$ are supplied to the reactor at the substrate temperature of 840 Celsius degrees to grow optical guiding layers 122a and 122b. The optical guiding layer 122a comprises, for example, an undoped GaN layer, and the thickness thereof is 50 nm. The optical guiding layer 122b comprises, for example, an undoped InGaN layer, and the thickness thereof is 65 nm.

Next, an active layer 123 is grown thereon. At the substrate temperature of 70 Celsius degrees, TMG and $NH_3$ are supplied to the reactor to grow a barrier layer 123a of a GaN-based semiconductor at the barrier layer growth temperature. The barrier layer 123a is, for example, undoped GaN, and the thickness thereof is 15 nm. After the growth of the barrier layer 123a, the growth is interrupted and the substrate temperature is changed from 870 Celsius degrees to 750 Celsius degrees. At the well layer growth temperature after this change, TMG, TMI, and $NH_3$ are supplied to the reactor to grow an undoped InGaN well layer 123b. The thickness thereof is 3 nm. After the growth of the well layer 123b, the supply of TMI is stopped and the substrate temperature is changed from 750 Celsius degrees to 870 Celsius degrees while supplying TMG and $NH_3$ to the reactor. During this change, a part of an undoped GaN barrier layer is also grown. After completion of the temperature change, the rest of the undoped GaN barrier layer is grown thereon. The thickness of the GaN barrier layer 123b is 15 nm. Subsequently, the growth of the barrier layer, the temperature change, and the growth of the well layer are repeatedly carried out to form the InGaN well layers 123b and GaN barrier layers 123a.

At the substrate temperature of 840 Celsius degrees, TMG, TMI, and $NH_3$ are supplied to the reactor to grow optical guiding layers 124a and 124b on the active layer 123. The optical guiding layer 124b comprises an undoped InGaN layer. The thickness of the optical guiding layer 124b is 65 nm, and the indium composition thereof is 0.02. The optical guiding layer 124a comprises an undoped GaN layer. The thickness of the optical guiding layer 124a is 50 nm. In the present example, after an electron block layer 125 is grown on the optical guiding layer 124b, the optical guiding layer 124a is grown thereon. After the growth of the optical guiding layer 124b, the supply of TMG and TMI is stopped, and the substrate temperature is increased to 1000 Celsius degrees. At this temperature, TMG, TMA, $NH_3$ and $CP_2Mg$ are supplied to the reactor to grow the electron block layer 125. The electron block layer 125 is, for example, AlGaN. The thickness of the electron block layer 125 is, for example, 20 nm, and the Al composition thereof is 0.12.

A GaN-based semiconductor region is grown on the optical guiding layer 124a. After the growth of the optical guiding layer 124a, the supply of TMG and TMI is stopped, and the substrate temperature is increased to 1000 Celsius degrees. At this temperature, TMG, TMA, $NH_3$, and $Cp_2Mg$ are supplied to the reactor to grow a p-type cladding layer 126. The p-type cladding layer 126 is, for example, $Al_{0.06}Ga_{0.94}N$. The thickness of the p-type cladding layer 126 is, for example, 400 nm, and the Al composition thereof is 0.06. After this, the supply of TMA is stopped to grow a p-type contact layer. The p-type contact layer 127 comprises, for example, GaN, and the thickness thereof is, for example, 50 nm. After the film formation, the temperature of the reactor is decreased to room temperature, thereby fabricating the epitaxial substrate. The outermost surface of the epitaxial substrate has a desired morphology.

Electrodes are formed on this epitaxial substrate. First, an insulating film, such as a silicon oxide film, is grown, and a contact window is formed in this insulating film 128 by photolithography and etching The contact window is, for example, of a stripe shape, and the width thereof is, for example, 10 micrometers. Next, a p-side electrode (Ni/Au) 129a is formed on the p-type GaN contact layer. Then, a p-pad electrode (Ti/Au) is formed thereon. An n-side electrode (Ti/Al) 129b is formed on a back surface of the epitaxial substrate. The electrodes are annealed according to the procedure of electrode annealing (e.g., at 550 Celsius degrees for one minute) to produce a substrate product.

Figure 12:
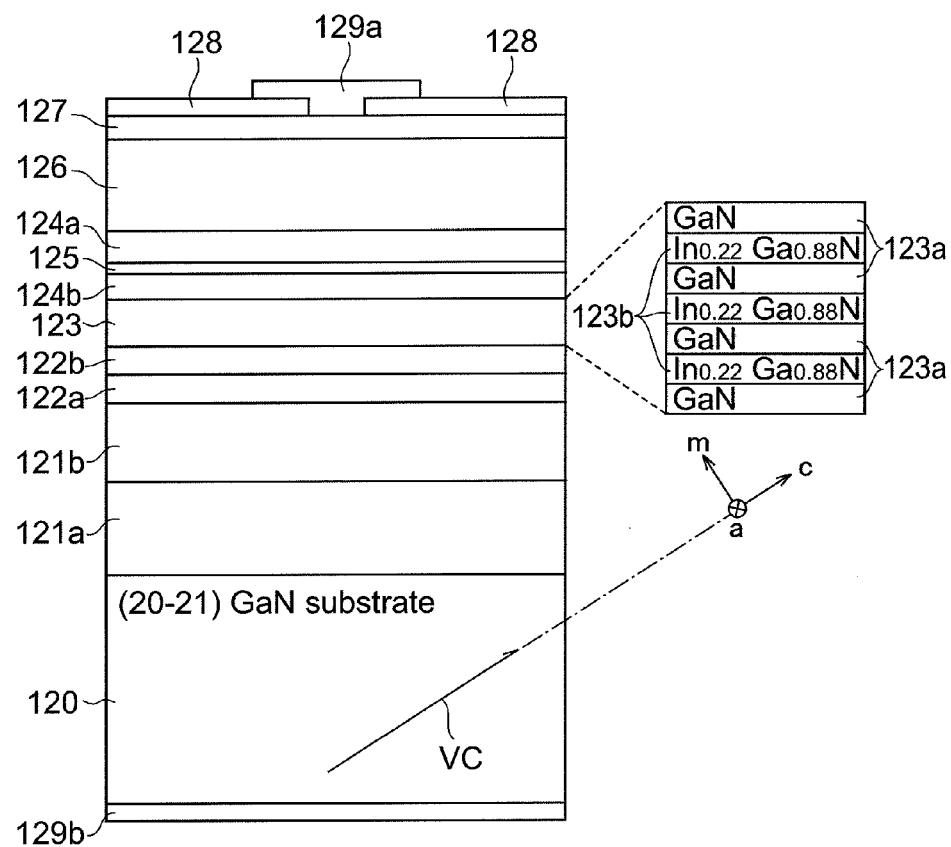
FIG. 12 is a drawing schematically showing a semiconductor laser in Example 2.

FIG. 12 is a drawing schematically showing the semiconductor laser in Example 2. The semiconductor laser shown in FIG. 12 is as follows:

GaN substrate 120: (20-21) plane.

N-type buffer layer 121a: Si-doped GaN, growth temperature 1050 Celsius degrees, thickness 1.5 µm.

N-type cladding layer 121b: Si-doped AlGaN, growth temperature 1050 Celsius degrees, thickness 500 nm, Al composition 0.04.

Optical guiding layer 122a: undoped GaN, growth temperature 840 Celsius degrees, thickness 50 nm.

Optical guiding layer 122b: undoped InGaN, growth temperature 840 Celsius degrees, thickness 65 nm, In composition 0.03.

Active layer 123.

Barrier layers 123a: undoped GaN, growth temperature 870 Celsius degrees, thickness 15 nm.

Well layers 123b: undoped InGaN, growth temperature 750 Celsius degrees, thickness 3 nm, In composition 0.22.

Optical guiding layer 124b: undoped InGaN, growth temperature 840 Celsius degrees, thickness 65 nm, In composition 0.03.

Electron block layer 125: Mg-doped AlGaN, growth temperature 1000 Celsius degrees, thickness 20 nm, Al composition 0.12.

Optical guiding layer 124a: undoped GaN, growth temperature 840 Celsius degrees, thickness 50 nm.

P-type cladding layer 126: Mg-doped AlGaN, growth temperature 1000 Celsius degrees, thickness 400 nm, Al composition 0.06.

P-type contact layer 127: Mg-doped GaN, growth temperature 1000 Celsius degrees, thickness 50 nm.

The substrate product that is produced through these steps is cleaved along a-planes at intervals of 800 µm. A reflecting film of $SiO_2/TiO_2$ multilayer film is formed on each of a-face cleaved facets for an optical cavity to produce a gain-guiding laser diode. The reflectance of the front end face is 80%, and the reflectance of the rear end face is 95%. The lasing wavelength of this laser diode is 520 nm. The threshold current thereof is 20 $kA/cm^2$, and the driving voltage (current value: 1600 mA) is 7.2 V.

As described above, the embodiment provides the III-nitride semiconductor device having the semipolar epitaxial film of the excellent surface morphology. In addition, the embodiment provides the epitaxial substrate for this III-nitride semiconductor device. Furthermore, the embodiment provides the method for fabricating the III-nitride semiconductor device and epitaxial substrate.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A III-nitride semiconductor device comprising:
a support base comprising a III-nitride semiconductor and having a primary surface, the primary surface extending along a first reference plane perpendicular to a reference axis, the reference axis being inclined at a predetermined angle with respect to a c-axis of the III-nitride semiconductor; and
an epitaxial semiconductor region provided on the primary surface of the support base,
the epitaxial semiconductor region comprising GaN-based semiconductor layers,
the reference axis being inclined at a first angle in a range of not less than 10 degrees and less than 80 degrees with respect to the c-axis of the III-nitride semiconductor toward a first crystal axis, the first crystal axis being either one of m-axis and a-axis of the III-nitride semiconductor,
the reference axis being inclined at a second angle in a range of not less than −0.30 degrees and not more than +0.30 degrees with respect to the c-axis of the III-nitride semiconductor toward a second crystal axis, the second crystal axis being another of the m-axis and a-axis,
a morphology of an outermost surface of the epitaxial semiconductor region including plural pits, and
a pit density of the pits being not more than $5\times10^4$ $cm^{-2}$.

2. The III-nitride semiconductor device according to claim 1,
wherein at an opening of each of the pits, a first width of the opening in a first direction is smaller than a second width of the opening in a second direction perpendicular to the first direction, and the first direction is defined by a line of intersection of the pit and a second reference plane defined by the c-axis of the III-nitride semiconductor and the first crystal axis.

3. The III-nitride semiconductor device according to claim 1, wherein a thickness of the epitaxial semiconductor region is not less than 2 μm.

4. The III-nitride semiconductor device according to claim 1, wherein a part of the pits have a depth of not less than 100 nm.

5. The III-nitride semiconductor device according to claim 1, wherein the first angle is not less than 63 degrees and is less than 80 degrees.

6. The III-nitride semiconductor device according to claim 1, wherein the second angle is in a range of not less than −0.10 degrees and not more than +0.10 degrees.

7. The III-nitride semiconductor device according to claim 1, wherein the pit density is not more than $5\times10^3$ $cm^{-2}$.

8. The III-nitride semiconductor device according to claim 1,
wherein the epitaxial semiconductor region comprises an InGaN layer, and
wherein the first angle is not less than 70 degrees and is less than 80 degrees.

9. The III-nitride semiconductor device according to claim 8, wherein the first angle is not less than 72 degrees and is less than 78 degrees.

10. The III-nitride semiconductor device according to claim 1, further comprising an electrode in contact with the epitaxial semiconductor region.

11. The III-nitride semiconductor device according to claim 1,
wherein the epitaxial semiconductor region comprises a first conductivity type GaN-based semiconductor layer, a second conductivity type GaN-based semiconductor layer, and a light emitting layer, and
wherein the light emitting layer is provided between the first conductivity type GaN-based semiconductor layer and the second conductivity type GaN-based semiconductor layer.

12. The III-nitride semiconductor device according to claim 1,
wherein the III-nitride semiconductor of the support base comprises GaN.

13. The III-nitride semiconductor device according to claim 1, wherein a dislocation density of the support base is not more than $1\times10^6$ $cm^{-2}$.

14. An epitaxial substrate for a III-nitride semiconductor device, comprising:
a substrate comprising a III-nitride semiconductor and having a primary surface, the primary surface extending along a first reference plane perpendicular to a reference axis, the reference axis being inclined at a predetermined angle with respect to a c-axis of the III-nitride semiconductor; and
an epitaxial semiconductor region provided on the primary surface of the substrate,
the epitaxial semiconductor region comprising plural GaN-based semiconductor layers,
the reference axis being inclined at a first angle in a range of not less than 10 degrees and less than 80 degrees with respect to the c-axis of the III-nitride semiconductor toward a first crystal axis, the first crystal axis being either one of m-axis and a-axis of the III-nitride semiconductor,
the reference axis being inclined at a second angle in a range of not less than −0.30 degrees and not more than +0.30 degrees with respect to the c-axis of the III-nitride semiconductor toward a second crystal axis, the second crystal axis being another of the m-axis and a-axis,
a morphology of an outermost surface of the epitaxial semiconductor region including plural pits, and
a pit density of the pits being not more than $5\times10^4$ $cm^{-2}$.

15. The epitaxial substrate according to claim 14,
wherein at an opening of each of the pits, a first width of the opening in a first direction is smaller than a second width of the opening in a second direction perpendicular to the first direction, and the first direction is defined by a line of intersection of the pit and a second reference plane defined by the first crystal axis and the c-axis of the III-nitride semiconductor.

16. The epitaxial substrate according to claim 14, wherein a thickness of the epitaxial semiconductor region is not less than 2 μm.

17. The epitaxial substrate according to claim 14, wherein the first angle is not less than 63 degrees and is less than 80 degrees.

18. The epitaxial substrate according to claim 14,
wherein the epitaxial semiconductor region comprises a first conductivity type GaN-based semiconductor layer, a second conductivity type GaN-based semiconductor layer, and a light emitting layer, and wherein the light emitting layer is provided between the first conductivity type GaN-based semiconductor layer and the second conductivity type GaN-based semiconductor layer.

19. The epitaxial substrate according to claim 14, wherein the III-nitride semiconductor of the substrate comprises GaN.

20. The epitaxial substrate according to claim 14, wherein a dislocation density of the substrate is not more than $1\times10^6$ cm$^{-2}$.

21. A method of fabricating a III-nitride semiconductor device, comprising the steps of:
preparing a substrate, the substrate comprising a III-nitride semiconductor and having a primary surface, the primary surface extending along a first reference plane perpendicular to a reference axis, and the reference axis being inclined at a predetermined angle with respect to a c-axis of the III-nitride semiconductor; and
growing an epitaxial semiconductor region on the primary surface of the substrate, the epitaxial semiconductor region comprising plural GaN-based semiconductor layers,
the epitaxial semiconductor region comprising the GaN-based semiconductor layers,
the reference axis being inclined at a first angle in a range of not less than 10 degrees and less than 80 degrees with respect to the c-axis of the III-nitride semiconductor toward a first crystal axis, the first crystal axis being either one of m-axis and a-axis of the III-nitride semiconductor,
the reference axis being inclined at a second angle in a range of not less than −0.30 degrees and not more than +0.30 degrees with respect to the c-axis of the III-nitride semiconductor toward a second crystal axis, the second crystal axis being the other of the m-axis and a-axis,
a morphology of an outermost surface of the epitaxial semiconductor region including a plurality of pits, and
a pit density of the pits being not more than $5\times10^4$ cm$^{-2}$.

22. The method of fabricating the III-nitride semiconductor device according to claim 21, further comprising the step of forming an electrode in contact with the epitaxial semiconductor region.

23. The method of fabricating the III-nitride semiconductor device according to claim 21,
wherein the epitaxial semiconductor region comprises a first conductivity type GaN-based semiconductor layer, a second conductivity type GaN-based semiconductor layer, and a light emitting layer, and
wherein the light emitting layer is provided between the first conductivity type GaN-based semiconductor layer and the second conductivity type GaN-based semiconductor layer.

24. The method of fabricating the III-nitride semiconductor device according to claim 21,
wherein at an opening of each of the pits, a first width of the opening in a first direction is smaller than a second width of the opening in a second direction perpendicular to the first direction, and the first direction is defined by a line of intersection of the pit and a second reference plane defined by the first crystal axis and the c-axis of the III-nitride semiconductor.

25. A III-nitride semiconductor device comprising:
a support base comprising a III-nitride semiconductor and having a primary surface, the primary surface extending along a first reference plane perpendicular to a reference axis, the reference axis being inclined at a first angle with respect to a c-axis of the III-nitride semiconductor toward a first crystal axis, the first crystal axis being either one of m-axis and a-axis of the III-nitride semiconductor, the first angle being in a range of not less than 10 degrees and less than 80 degrees, the reference axis being inclined at a second angle with respect to the c-axis of the III-nitride semiconductor toward a second crystal axis, the second crystal axis being the other of the m-axis and a-axis, and the second angle being in a range of not less than −0.30 degrees and not more than +0.30 degrees; and
an epitaxial semiconductor region provided on the primary surface of the support base,
the epitaxial semiconductor region comprising GaN-based semiconductor layers,
a morphology of an outermost surface of the epitaxial semiconductor region including plural pits, and
a pit density of the pits being not more than $5\times10^4$ cm$^{-2}$.

* * * * *